United States Patent [19]
Akram et al.

[11] Patent Number: 5,844,419
[45] Date of Patent: Dec. 1, 1998

[54] METHOD FOR TESTING SEMICONDUCTOR PACKAGES USING DECOUPLING CAPACITORS TO REDUCE NOISE

[75] Inventors: Salman Akram; David R. Hembree; Alan G. Wood, all of Boise, Id.

[73] Assignee: Micron Technology, Inc., Boise, Id.

[21] Appl. No.: 647,704

[22] Filed: May 14, 1996

[51] Int. Cl.⁶ .............................. G01R 31/26; H01R 9/09
[52] U.S. Cl. ............................................. 324/755; 324/765
[58] Field of Search ................................. 324/537, 754, 324/755, 765; 438/14, 17; 257/48

[56] References Cited

U.S. PATENT DOCUMENTS

| | | | |
|---|---|---|---|
| 3,189,974 | 6/1965 | Fabricius | 29/25.42 |
| 3,900,788 | 8/1975 | Behn et al. | 321/15 |
| 4,668,041 | 5/1987 | La Komski et al. | 439/620 |
| 5,043,533 | 8/1991 | Spielberger | 174/52.4 |
| 5,093,774 | 3/1992 | Cobb | 361/306 |
| 5,103,283 | 4/1992 | Hite | 357/51 |
| 5,155,656 | 10/1992 | Narashimhan et al. | 361/309 |
| 5,272,590 | 12/1993 | Hernandez | 361/306.2 |
| 5,604,445 | 2/1997 | Desai et al. | 324/755 |
| 5,734,270 | 3/1998 | Buchanan | 324/754 |

*Primary Examiner*—Glenn W. Brown
*Attorney, Agent, or Firm*—Stephen A. Gratton

[57] ABSTRACT

A method for the testing semiconductor packages is provided. The method includes electrically connecting a decoupling capacitor directly to the leads of the semiconductor package being tested, or alternately, directly to contact members of an electrical connector for the package. The decoupling capacitor is formed as a thin film capacitor that is mounted on the electrical connector of a testing apparatus such as a burn-in board. In an illustrative embodiment, the decoupling capacitor is configured with a power contact that contacts the Vcc lead for the package and a ground contact that contacts the Vss lead for the package. The decoupling capacitor functions to reduce power supply noise and spurious signals during testing of the integrated circuits formed on the semiconductor die contained within the package.

37 Claims, 2 Drawing Sheets

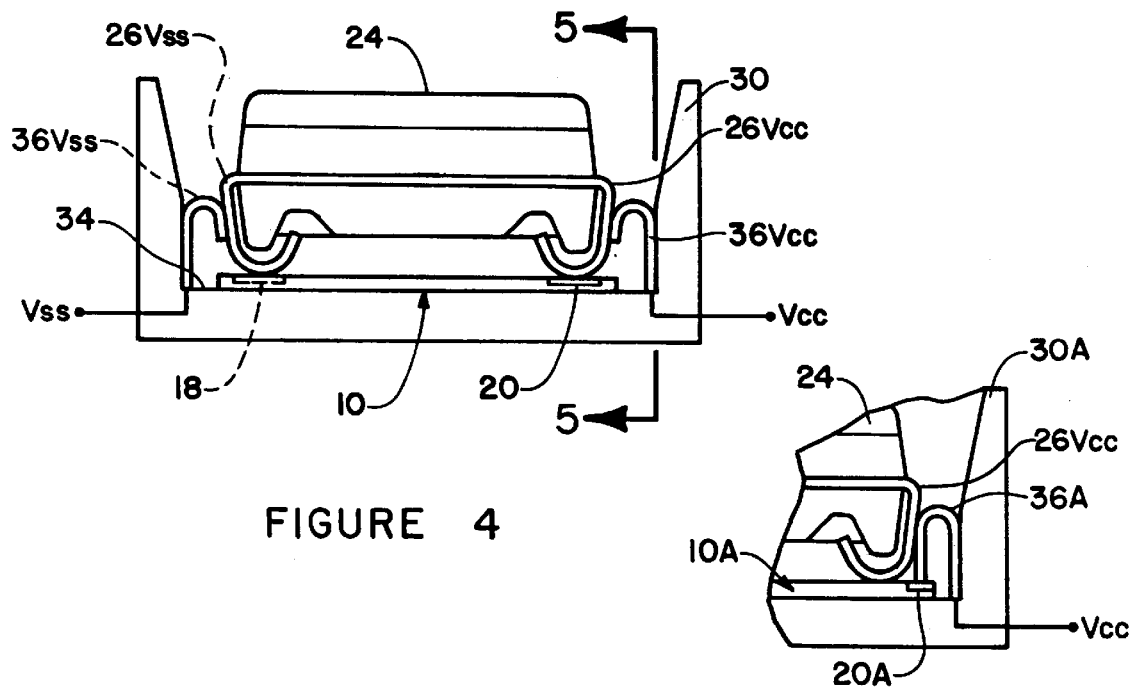
FIGURE 4
FIGURE 4A
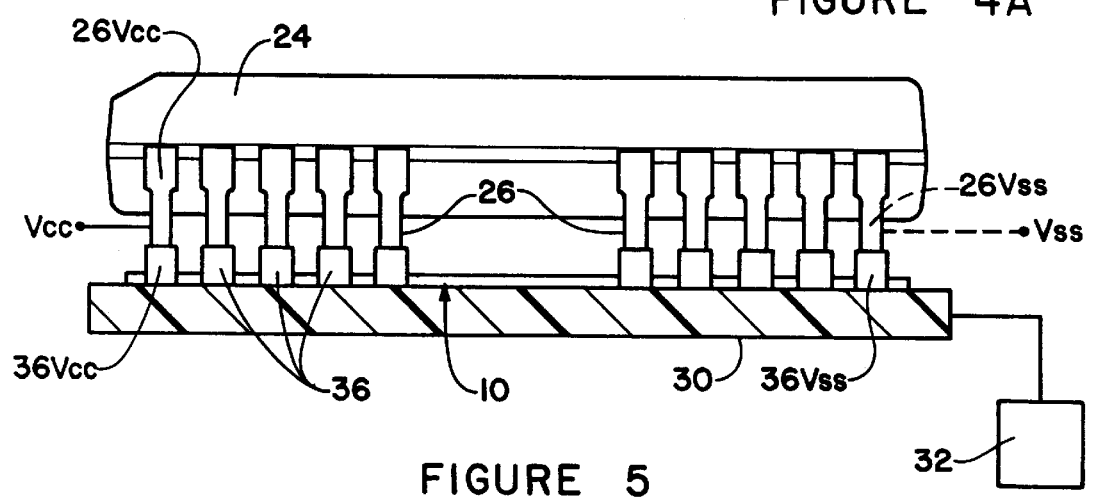
FIGURE 5
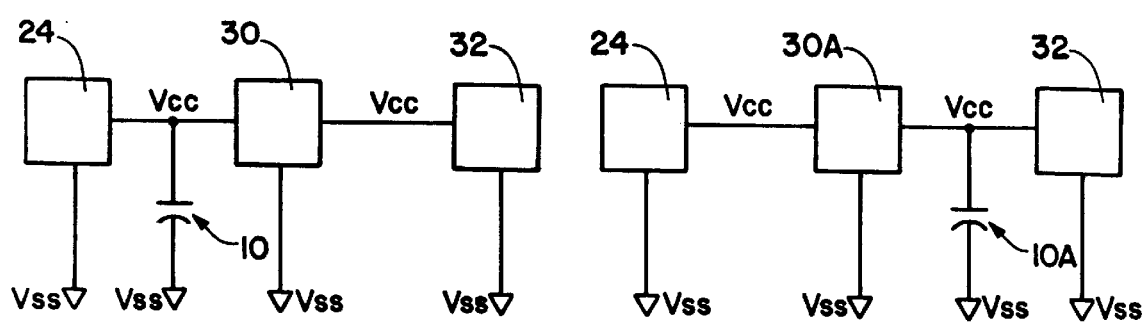
FIGURE 6
FIGURE 6A 5,844,419

METHOD FOR TESTING SEMICONDUCTOR PACKAGES USING DECOUPLING CAPACITORS TO REDUCE NOISE

FIELD OF THE INVENTION

This invention relates generally to testing of semiconductor dice and specifically to an improved method for testing packaged dice with reduced noise using decoupling capacitors.

BACKGROUND OF THE INVENTION

Packaged semiconductor dice are routinely tested following the packaging process. During a test procedure for a device under test (DUT), test signals are applied to the package leads and various electrical characteristics of the integrated circuits contained on the device are evaluated. Among the tests performed are dynamic burn-in, input/output leakage, speed verification, opens, shorts, refresh and a range of algorithms to verify AC parameters.

Testing can be performed using test apparatus that provides an electrical interface between the leads of the package and test circuitry. For example, burn-in boards are adapted to hold a large number of semiconductor packages in a chamber with temperature cycling capability and to apply test signals to the dice. A burn-in board includes electrical connectors that mate with the leads on the packages to establish an electrical connection with test circuitry. For semiconductor packages having male leads, such as pins, the burn-in board typically includes socket type electrical connectors. For packaged dice having female leads, such as flat pads, the burn-in board typically includes pogo pin connectors.

One consideration during electrical testing of semiconductor packages is parasitic induction. Parasitic inductors can arise in various electrical components of the dice and packages and in the test circuits that interface with the package leads. For example, parasitic inductors can result from switching transients and from cross coupling between conductors in the circuit path to the leads of the packages. These parasitic inductors can adversely effect the test procedure by causing the power supply voltage to drop or modulate during the test procedure.

This drop or modulation in the power supply due to parasitic inductors is sometimes referred to as power supply noise. If the magnitude of the power supply noise is large enough, the operation of the integrated circuits and the test results can be compromised.

In order to reduce power supply noise and spurious signals during testing, decoupling capacitors are sometimes electrically connected to the power and ground leads of semiconductor packages. In the past these decoupling capacitors have been formed as part of the test board circuitry. However, parasitic inductance can occur in the conductive path from the decoupling capacitors to the packages. For example, if the decoupling capacitors are formed on the test circuitry associated with a burn-in board, electrical conductors and connectors are required to form an electrical path between the capacitors, the burn-in board and the device under test (DUT). Elements of this electrical path can function as parasitic inductors causing power supply noise.

It would be desirable to reduce inductor formation and power supply noise during a test procedure due to the circuit path from conventionally located decoupling capacitors. This reduction in power supply noise would improve the test procedure and allow faster switching signals to be employed without detriment to the test procedure. The present invention recognizes that inductor formation and power supply noise can be reduced by mounting a decoupling capacitor as physically close as possible to the leads of the device under test.

SUMMARY OF THE INVENTION

In accordance with the present invention, a method for testing semiconductor packages, and a capacitor configured to directly contact semiconductor packages for testing, are provided. The method, simply stated, comprises mounting a planar thin film capacitor to an electrical connector (e.g., socket) of a test apparatus (e.g., burn-in board) and then mounting a semiconductor package directly on the capacitor. During a test procedure, the capacitor functions to reduce power supply noise and spurious signals present on the package leads.

The capacitor includes an upper electrode and a lower electrode separated by a dielectric film. Electrode contacts are formed in electrical communication with the electrodes and are configured for direct physical and electrical contact with select leads of the package. In the illustrative embodiment, the capacitor includes a power electrode contact configured for direct electrical connection to a positive power (Vcc) lead of the package, and a ground electrode contact configured for direct electrical connection to a ground (Vss) lead of the package.

In an alternate embodiment, the capacitor is configured for placement in the electrical connector with the electrode contacts of the capacitor in direct physical and electrical contact with contact members of the electrical connector that contact select package leads (e.g., positive power (Vcc) and ground (Vss) leads).

BRIEF DESCRIPTION OF THE DRAWINGS

FIG. 4 is a side elevation view of the capacitor and a semiconductor package mounted within the electrical connector with the leads of the package in direct electrical contact with the capacitor;

FIG. 4A is a partial side elevation view of the package and an alternate embodiment capacitor and connector configured such that the capacitor is in direct electrical contact with contact members of the connector;

FIG. 5 is a cross sectional view taken along section line 5—5 of FIG. 4;

FIG. 6 is an electrical schematic showing the circuit formed between the capacitor, the semiconductor package and the connector with the embodiment illustrated in FIG. 4; and FIG. 6A is an electrical schematic showing the circuit formed between the capacitor, the semiconductor package and the connector with the embodiment illustrated in FIG. 4A.

DETAILED DESCRIPTION OF THE PREFERRED EMBODIMENT

Figure 1:
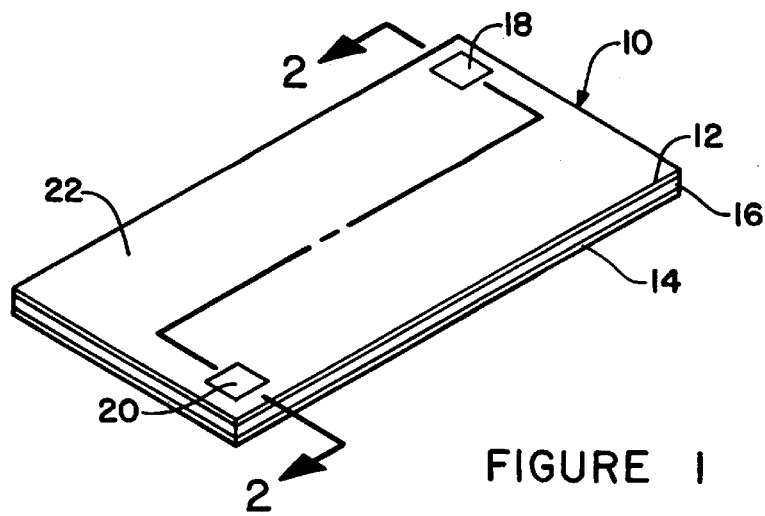
FIG. 1 is a perspective view of a capacitor fabricated in accordance with the invention.
Figure 2:
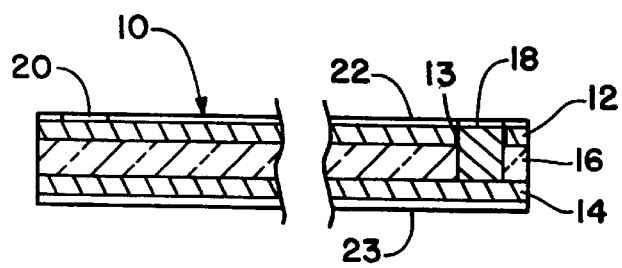
FIG. 2 is a cross sectional view taken along section line 2—2 of FIG. 1.

Referring to FIGS. 1 and 2, a capacitor 10 constructed in accordance with the invention is shown. The capacitor 10 includes an upper electrode 12 and a lower electrode 14 separated by a dielectric layer 16. The capacitor 10 also includes an insulating layer 22 formed on the upper electrode 12 and an insulating layer 23 formed on the lower electrode 14. In addition, the capacitor 10 includes a lower electrode contact 18 in electrical communication with the lower electrode 14, and an upper electrode contact 20 in electrical communication with the upper electrode 12.

The capacitor 10 is configured for mounting to a connector 34 (FIG. 3) of a test apparatus and to electrically connect to a semiconductor package 24 (FIG. 4) referred to as the device under test (DUT). In the illustrative embodiment, the package 24 (FIG. 4) is a small outline J-bend package (SOJ). However, the SOJ configuration is merely exemplary and the capacitor 10 can be fabricated to accommodate other standard semiconductor package configurations such as DIP (dual in line), ZIP (zig zag in line), LCC (leadless chip carrier), SOP (small outline package), QFP (quad flat pack), TSOP (thin small outline), PGA (pin grid array), LGA (land grid array), BGA (ball grid array) and chip scale packages.

The upper electrode 12 and lower electrode 14 of the capacitor 10 can be formed of conductive thin films. Preferred conductive thin films for the electrodes 12, 14 include aluminum, copper, nickel, gold and palladium/silver alloys. Barrier layers (not shown), formed of inert metals such as titanium and tungsten or alloys thereof, can also be formed between the electrodes 12, 14 and the dielectric layer 16.

The dielectric layer 16 can be formed of a thin film dielectric material having a desired dielectric constant. Preferred dielectric materials for the dielectric layer 16 include polymers, oxides, nitrides, ceramics or other high dielectric materials. For example, polyimide, tantalum pentoxide ($Ta_2O_5$) and polyvinylidenefluoride (PVDF) are suitable dielectric materials.

The capacitor 10 can be fabricated by depositing the upper electrode 12 and lower electrode 14 on the dielectric layer 16 using a deposition process such as CVD, sputtering or evaporation. Alternately, the capacitor 10 can be fabricated from a pre-formed laminate for the upper electrode 12, lower electrode 14 and dielectric layer 16. For example, suitable thin film laminates are manufactured by Goodfellow Corporation of Pennsylvania and include a polyvinylidenefluoride dielectric layer metallized on both sides with an aluminum film.

In the illustrative embodiment the capacitor 10 is generally rectangular shaped and planar and has a thicknesses of from 0.0005 mm to 0.5 mm. The thin planar shape of the capacitor 10 permits it to be used with a standard electrical connector 30 because the function of the electrical connector 30 is largely unaffected by the capacitor 10.

The insulating layer 22 for the upper electrode 12 can be formed as a thin film of an insulating material deposited on or laminated to the upper electrode 12. The insulating layer 23 for the lower electrode 14 can be formed as a thin film of an insulating material deposited on or laminated to the lower electrode 14. Suitable materials for the insulating layers 22, 23 include insulating polymers such as polyimide.

The upper electrode contact 20 comprises a window through the insulating layer 22 to the upper electrode 12. The lower electrode contact 18 comprises a conductive plug formed through the upper electrode 12 and through dielectric layer 16 to the lower electrode 14. A window is formed through the insulating layer 22 on the upper electrode 12 to the lower electrode contact 18. In addition, an insulated via 13 is formed through the upper electrode 12 to electrically isolates the upper electrode 12 from the lower electrode contact 18. The lower electrode contact 18 can also be formed by aligned windows (not shown) through the insulating layer 22, through the upper electrode 12 and through the dielectric layer 16 to the lower electrode 14.

The upper electrode contact 20 and lower electrode contact 18 have a size and spacing that correspond to the size and spacing of the package leads 26 (FIG. 5). As will be further explained, in the illustrative embodiment, the upper electrode contact 20 is configured for contacting the Vcc lead 26Vcc (FIG. 4) on the semiconductor package 24. The lower electrode contact 18 is configured for contacting the Vss lead 26Vss (FIG. 4) on the semiconductor package 24.

With the package 24 provided in a SOJ configuration, the package leads 26 (FIG. 5) have a width of about 0.018 inches, a pitch of about 0.050 inches and a spacing between the center lines of the leads 26 on the opposite sides of the package 24 of about 0.270 inches. Accordingly, the upper electrode contact 20 and lower electrode contact 18 can be configured to accommodate this particular lead configuration. Alternately, the upper electrode contact 20 and lower electrode contact 18 can be configured to accommodate lead configurations for other standard semiconductor packages as previously identified. In addition, the capacitor 10 can be configured with additional contacts as required to contact more than two leads on the package 24.

Preferably the capacitor 10 is constructed with predetermined electrical characteristics to accommodate the electrical characteristics of the semiconductor die contained within the package 24. For example, the value of the capacitance (C) of the capacitor 10 is a function of the area (A) of the dielectric material 16, the distance (d) between the electrodes 12 and 14, and the dielectric constant or permittivity ($\in$) of the dielectric material 16. These parameters can be related by the well known formula $C=\in A/d$. Depending on the application, the value of C can be selected from micro farads ($\mu F$) to pico farads (pF).

Figure 3:
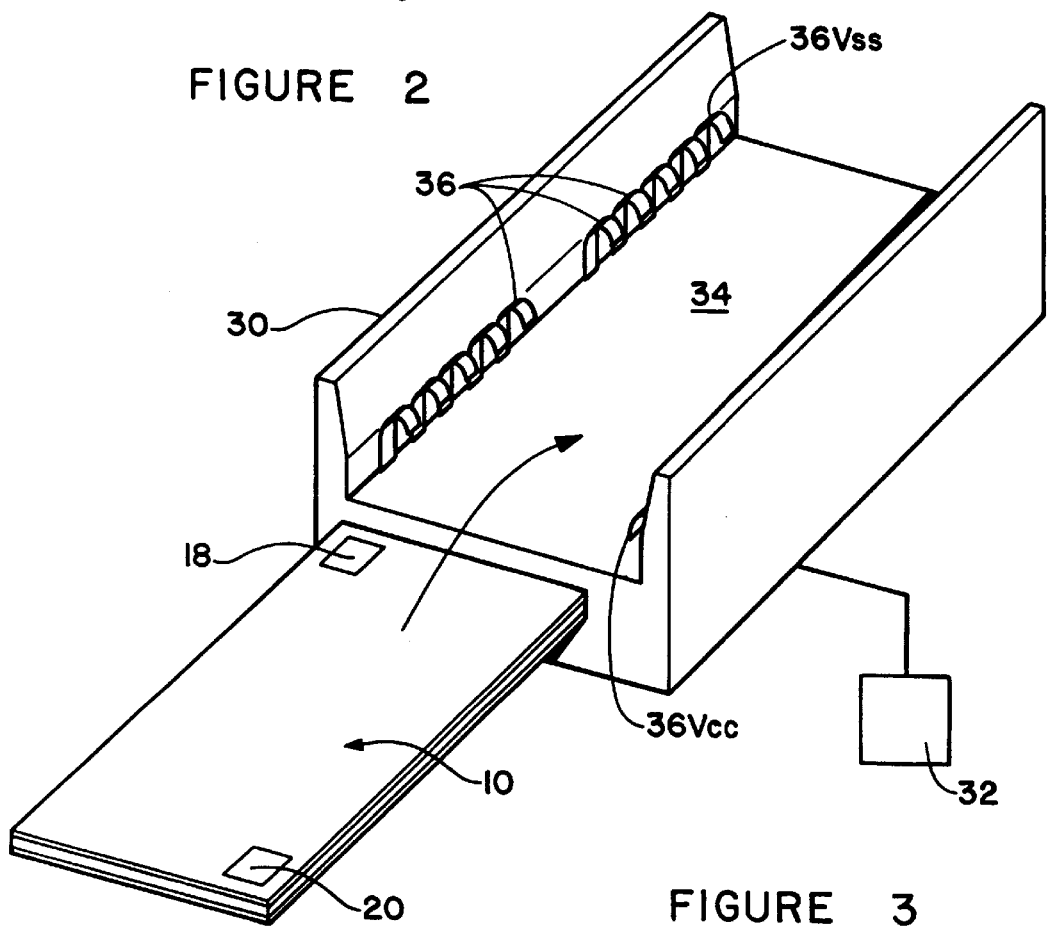
FIG. 3 is an exploded perspective view of the capacitor and an electrical connector of a testing apparatus configured for testing a semiconductor package in accordance with the invention.

Referring to FIG. 3, the electrical connector 30 is shown. The electrical connector 30 is a component of the test apparatus for testing the semiconductor package 24 (FIG. 4). In the illustrative embodiment, the connector 30 is a component of a burn-in board 32 and is in electrical communication with external test circuitry (not shown). The connector 30 and burn-in board 32 can be commercially available components. For example, connectors for burn-in boards are manufactured by Micron Systems Integration Inc., Boise, Id. under the trademark AMBYX™ intelligent burn-in and test system. The electrical connector 30 is adapted to make a temporary electrical connection to the package 24 (FIG. 4) for applying and receiving test signals from the integrated circuits formed on the semiconductor die contained within the package 24.

The electrical connector 30 includes a recessed surface 34 wherein the capacitor 10 can be mounted. The capacitor 10 can be merely placed on the recessed surface 34 or a thin adhesive layer (not shown) an be used to secure the capacitor 10 to the recessed surface 34. However, placing the capacitor 10 in a non-secured configuration allows different value capacitors 10 to be easily interchanged for testing different types of packages 24.

The electrical connector 30 also includes a plurality of contact members 36 configured to contact the leads 26 (FIG. 5) on the package 24. A contact member 36Vss on the connector 30 is configured to contact the Vss lead 26Vss (FIG. 5) on the package 24. Another contact member 36Vcc on the connector 30 is configured to contact the Vcc lead 26Vcc (FIG. 5) on the package 24.

In the illustrative embodiment, the package 24 (FIG. 4) is adapted to be inserted from above into the electrical connector 30. The contact members 36 on the connector 30 are adapted to flex to initiate and maintain electrical contact with the package leads 26. The contact members 36 on the connector 30 are in electrical communication with pins (not shown) or other conductors that establish electrical communication with the burn-in board 32 and the external test circuitry (not shown). This type of electrical connector 30 is sometimes referred to as a zero insertion force socket.

As shown in FIGS. 4 and 5, during a test procedure the capacitor 10 mounts to the recessed surface 34 of the electrical connector 30. The package 24 is inserted into the connector 30 directly on top of the capacitor 10 and is supported by the capacitor 10. In the embodiment illustrated in FIG. 4, the Vcc lead 26Vcc on the package 24 is in electrical communication with the upper electrode contact 20 on the capacitor 10 and with the Vcc contact member 36Vcc on the connector 30. At the same time, the Vss lead 26Vss on the package 24 is in electrical communication with the lower electrode contact 18 on the capacitor 10 and with the Vss contact member 36Vss on the connector 30.

An alternate embodiment capacitor 10A is illustrated in FIG. 4A. In this embodiment the package leads 26 do not directly contact the electrode contacts 18,20. Rather the capacitor 10A and connector 30A are configured such that a contact member 36A on the connector 30A contacts both the Vcc lead 26Vcc on the package 24 and the upper electrode contact 20A on the capacitor 10. Similarly, a corresponding contact member (not shown) on the connector 30A is adapted to contact both the Vss lead 26Vss on the package 24 and the lower electrode lead 18A (not shown) on the capacitor 10A.

FIG. 6 illustrates the electrical circuit with the capacitor 10 and connector 30 configured as shown in FIG. 4. In this embodiment, the capacitor 10 is located in the power (i.e., Vcc) circuit path between the package 24 and the connector 30. During a test procedure, the capacitor 10 charges to the level of Vcc to maintain a relatively constant supply voltage to the integrated circuits formed on the die contained within the package 24. In addition, the capacitor 10 provides a path to ground (i.e., Vss) to shunt or reduce power supply noise that would otherwise be present on the Vcc lead 26Vcc (FIG. 4) of the package 24. Because the capacitor 10 is electrically connected directly to the package leads 26, the formation of parasitic inductors between the capacitor 10 and package 24 is minimized or substantially eliminated. This permits the integrated circuits to be tested using faster switching speeds with less power noise.

FIG. 6A illustrates the electrical circuit with the capacitor 10A and connector 30A configured as shown in FIG. 4A. In this embodiment the capacitor 10A is located in the power (i.e., Vcc) circuit path between the connector 30A and the burn-in board 32. During a test procedure, the capacitor 10A provides a constant supply voltage (i.e., Vcc) and a path to ground (i.e., Vss) to shunt all or a portion of power supply noise that would otherwise be applied to the Vcc lead of the package 24.

With either embodiment, because the capacitor 10 (or 10A) can be easily removed and installed on the electrical connector 30 (or 30A), customized capacitors for a particular application can be interchangeable on the same connector 30 (or 30A). For example, the capacitor 10 can be configured with electrode contact configurations and electrical characteristics to accommodate the testing of different types of packaged dice (e.g., DIP, ZIP, LCC, SOP, QFP, TSOP, SOJ, PGA, LGA, BGA, chip scale packages). Furthermore, because the capacitor 10 (or 10A) is mounted as close as possible to the package 24, parasitic inductors in the conductive path to the package leads 26 are substantially eliminated.

Thus the invention provides an improved method, an improved system and an improved capacitor for testing semiconductor packages with reduced noise and higher switching speeds. While the invention has been described with reference to certain preferred embodiments, as will be apparent to those skilled in the art, certain changes and modifications can be made without departing from the scope of the invention as defined by the following claims.

What is claimed is:

1. A method for testing a semiconductor package comprising:
    providing a test apparatus comprising an electrical connector for establishing electrical communication with the package;
    providing a thin film capacitor; and
    mounting the capacitor on the connector and the package on the capacitor in electrical contact with selected leads of the package.

2. The method of claim 1 and wherein the selected leads comprise a power lead for the package and a ground lead for the package.

3. The method of claim 1 wherein the test apparatus comprises a burn-in board.

4. The method of claim 1 wherein the capacitor has a thickness of from 0.0005 mm to 0.5 mm.

5. The method of claim 1 wherein the capacitor comprises a first electrode contact and a second electrode contact configured to electrically contact a power lead and a ground lead respectively for the package.

6. A method for testing a semiconductor package comprising:
    providing a test apparatus comprising an electrical connector for establishing electrical communication with the package;
    providing a thin film capacitor comprising a first electrode and a second electrode separated by a dielectric layer, said first electrode in electrical communication with a first electrode contact, said second electrode in electrical communication with a second electrode contact;
    mounting the capacitor on the connector with the first electrode contact in direct physical and electrical contact with a first lead of the package and with the second electrode contact in direct physical and electrical contact with a second lead of the package; and
    applying test signals to the first and second leads.

7. The method of claim 6 wherein the first lead comprises a power lead and the second lead comprises a ground lead for the package.

8. The method of claim 6 further comprising replacing the capacitor with a second capacitor having a third electrode contact and a fourth electrode contact configured for direct physical and electrical contact with selected leads of a second semiconductor package.

9. A method for testing a semiconductor package having a plurality of external leads comprising:
    forming a thin film capacitor comprising a first electrode and a second electrode separated by a dielectric layer, said first electrode in electrical communication with a first electrode contact, said second electrode in electrical communication with a second electrode contact;
    placing the first electrode contact and the second electrode contact in direct physical and electrical contact with selected leads of the package; and applying test signals to the selected leads.

10. The method of claim 9 wherein forming the capacitor comprises depositing thin films on the dielectric layer.

11. The method of claim 9 wherein forming the capacitor comprises assembling thin film laminates.

12. The method of claim 9 wherein the capacitor further comprises a first insulating layer formed on the first electrode and a second insulating layer formed on the second electrode.

13. The method of claim 12 wherein the first electrode contact comprises a window through the first insulating layer.

14. The method of claim 13 wherein the second electrode contact comprises a conductive plug insulated from the first electrode and formed through the dielectric layer to the second electrode.

15. A method for testing a semiconductor package comprising:

providing a test apparatus comprising an electrical connector comprising a first contact member for electrically contacting a first lead of the package and a second contact member for electrically contacting a second lead of the package;

providing a thin film capacitor comprising a first electrode and a second electrode separated by a dielectric layer, said first electrode in electrical communication with a first electrode contact, said second electrode in electrical communication with a second electrode contact; and mounting the capacitor on the connector with the first electrode contact in direct contact with the first contact member of the connector and with the second electrode contact in direct contact with the second contact member of the connector.

16. The method of claim 15 wherein the test apparatus comprises a burn-in board.

17. The method of claim 15 wherein the capacitor has a thickness of from 0.0005 mm to 0.5 mm.

18. The method of claim 15 wherein the first electrode and the second electrode comprise thin films deposited on the dielectric layer.

19. The method of claim 15 wherein the first electrode, the second electrode and the dielectric layer comprise pre-formed laminates attached to one another.

20. A method for testing a semiconductor package comprising a die with integrated circuits formed thereon, said method comprising:

providing a test apparatus configured for applying test signals to the integrated circuits, said test apparatus comprising an electrical connector with a plurality of contact members for establishing electrical communication with the package;

mounting a thin film capacitor on the electrical connector, said capacitor including a first electrode and a second electrode separated by a dielectric layer; and mounting the package on the capacitor with select contact members of the test apparatus in electrical communication with the first electrode or the second electrode and with select leads of the package.

21. The method of claim 20 wherein the first electrode and the second electrode comprise thin films deposited on the dielectric layer.

22. The method of claim 20 wherein the first electrode, the second electrode and the dielectric layer comprise pre-formed laminates.

23. The method of claim 20 wherein the package is selected from the group consisting of small outline j-bend, dual in line, zig zag in line, leadless chip carrier, small outline, quad flat pack, thin small outline, pin grid array, land grid array, ball grid array and chip scale packages.

24. A system for testing a semiconductor package comprising:

a test apparatus comprising a connector for establishing electrical communication with the package; and a thin film capacitor mounted to the connector and comprising a first electrode contact configured to directly contact a power lead for the package and a second electrode contact configured to directly contact a ground lead for the package.

25. The system of claim 24 wherein the capacitor comprises a first electrode and a second electrode comprising thin films deposited on a dielectric layer.

26. The system of claim 24 wherein the capacitor comprises a pre-formed laminate comprising a first electrode, a second electrode and a dielectric layer.

27. The system of claim 24 wherein the test apparatus comprises a burn-in board and wherein the connector is in electrical communication with test circuitry.

28. The system of claim 24 wherein the capacitor is placed on a surface of the connector and the package is placed directly on the capacitor.

29. The system of claim 24 wherein the capacitor has a thickness of from 0.0005 mm to 0.5 mm.

30. A system for testing a semiconductor package comprising:

a burn-in board comprising an electrical connector for establishing electrical communication with the package;

a thin film capacitor mounted to the connector, said capacitor comprising a first electrode and a second electrode separated by a dielectric layer;

a first contact on the first electrode and configured to directly contact a power lead for the package; and a second contact on the second electrode and configured to directly contact a ground lead for the package.

31. The system of claim 30 wherein the first electrode and the second electrode comprise insulating layers.

32. The system of claim 30 wherein the capacitor has a thickness of from 0.0005 mm to 0.1 mm.

33. A system for testing a semiconductor package comprising:

a test apparatus comprising a connector formed as a socket with contact members thereon for contacting external leads on the package;

a thin film capacitor mounted to the connector, said capacitor including a first electrode and a second electrode separated by a dielectric layer, said first electrode and second electrode comprising first and second electrode contacts configured to directly contact first and second contact members of the test apparatus, said first contact member in contact with a first external lead of the package and said second contact member in contact with a second external lead of the package.

34. The system of claim 33 wherein the connector comprises a socket having a recess wherein the capacitor is mounted with the package thereon.

35. The system of claim 33 wherein the test apparatus comprises a burn-in board.

36. The system of claim 33 wherein the first electrode and the second electrode comprise thin films deposited on the dielectric layer.

37. The system of claim 33 wherein the first electrode, the second electrode, and the dielectric layer comprise a pre-formed laminate.

* * * * *